(12) United States Patent
Kalafala et al.

(10) Patent No.: US 7,698,674 B2
(45) Date of Patent: Apr. 13, 2010

(54) SYSTEM AND METHOD FOR EFFICIENT ANALYSIS OF POINT-TO-POINT DELAY CONSTRAINTS IN STATIC TIMING

(75) Inventors: Kerim Kalafala, Rhinebeck, NY (US); Revanta Banerji, Beacon, NY (US); David J. Hathaway, Underhill, VT (US); Jessica Sheridan, Portland, OR (US); Chandramouli Visweswariah, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 425 days.

(21) Appl. No.: 11/565,803

(22) Filed: Dec. 1, 2006

(65) Prior Publication Data

US 2008/0134117 A1  Jun. 5, 2008

(51) Int. Cl.
*G06F 17/50* (2006.01)
*G06F 9/45* (2006.01)

(52) U.S. Cl. .................. 716/6; 716/2; 716/4; 716/7; 716/10; 703/15; 703/19; 703/20

(58) Field of Classification Search ............... 716/2, 716/6, 7, 10; 703/15, 19, 20
See application file for complete search history.

(56) References Cited

U.S. PATENT DOCUMENTS

| | | | | |
|---|---|---|---|---|
| 5,508,937 A * | 4/1996 | Abato et al. ............... | 716/6 |
| 5,535,145 A * | 7/1996 | Hathaway .................. | 703/2 |
| 5,576,979 A * | 11/1996 | Lewis et al. ............... | 716/6 |
| 5,825,658 A | 10/1998 | Ginetti et al. | |
| 6,058,252 A * | 5/2000 | Noll et al. ................. | 716/10 |
| 6,237,127 B1 | 5/2001 | Craven et al. | |
| 6,425,110 B1 * | 7/2002 | Hathaway et al. .......... | 716/2 |
| 6,430,731 B1 * | 8/2002 | Lee et al. .................. | 716/6 |
| 6,678,644 B1 * | 1/2004 | Segal ........................ | 703/15 |
| 6,754,877 B1 * | 6/2004 | Srinivasan ................. | 716/2 |
| 7,010,763 B2 * | 3/2006 | Hathaway et al. .......... | 716/2 |
| 7,142,991 B2 * | 11/2006 | Hathaway et al. .......... | 702/57 |
| 7,155,691 B2 * | 12/2006 | Ratzlaff .................... | 716/6 |
| 7,178,120 B2 * | 2/2007 | Hieter et al. .............. | 716/6 |
| 7,222,311 B2 * | 5/2007 | Kaufman et al. .......... | 716/2 |
| 7,293,248 B2 * | 11/2007 | Chang et al. .............. | 716/6 |
| 7,308,666 B1 * | 12/2007 | Li ............................ | 716/7 |
| 7,404,163 B2 * | 7/2008 | Chadwick et al. ......... | 716/6 |
| 7,424,694 B2 * | 9/2008 | Ikeda ....................... | 716/6 |

(Continued)

*Primary Examiner*—Helen Rossoshek
(74) *Attorney, Agent, or Firm*—H. Daniel Schnurmann

(57) ABSTRACT

A method and a system for conducting a static timing analysis on a circuit having a plurality of point-to-point delay constraints between two points of the circuit, in which two conservative and two optimistic user defined tests are derived for all types of the point-to-point delay constraints. The method shows that when a conservative test is performed without introducing any special tags, then it is found that the point-to-point constraint is satisfied. On the other hand, when the optimistic test fails without any special tags, it is determined that the point-to-point constraint is bound to fail if special tags are introduced, in which case, they are to be introduced only when an exact slack is desired. Finally, for anything in between, a real analysis with special tags or path tracing is required. Based on the topology of the graph, arrival time based tests may be tighter in some situations, while the required arrival time based tests, may be tighter in others.

14 Claims, 6 Drawing Sheets

U.S. PATENT DOCUMENTS

| | | |
|---|---|---|
| 7,428,716 B2 * | 9/2008 | Visweswariah ................ 716/6 |
| 7,437,697 B2 * | 10/2008 | Venkateswaran et al. ....... 716/6 |
| 2007/0276896 A1 * | 11/2007 | Kalafala et al. ............ 708/520 |
| 2008/0005709 A1 * | 1/2008 | Golander ....................... 716/6 |
| 2008/0072198 A1 * | 3/2008 | Celik et al. .................... 716/6 |

* cited by examiner

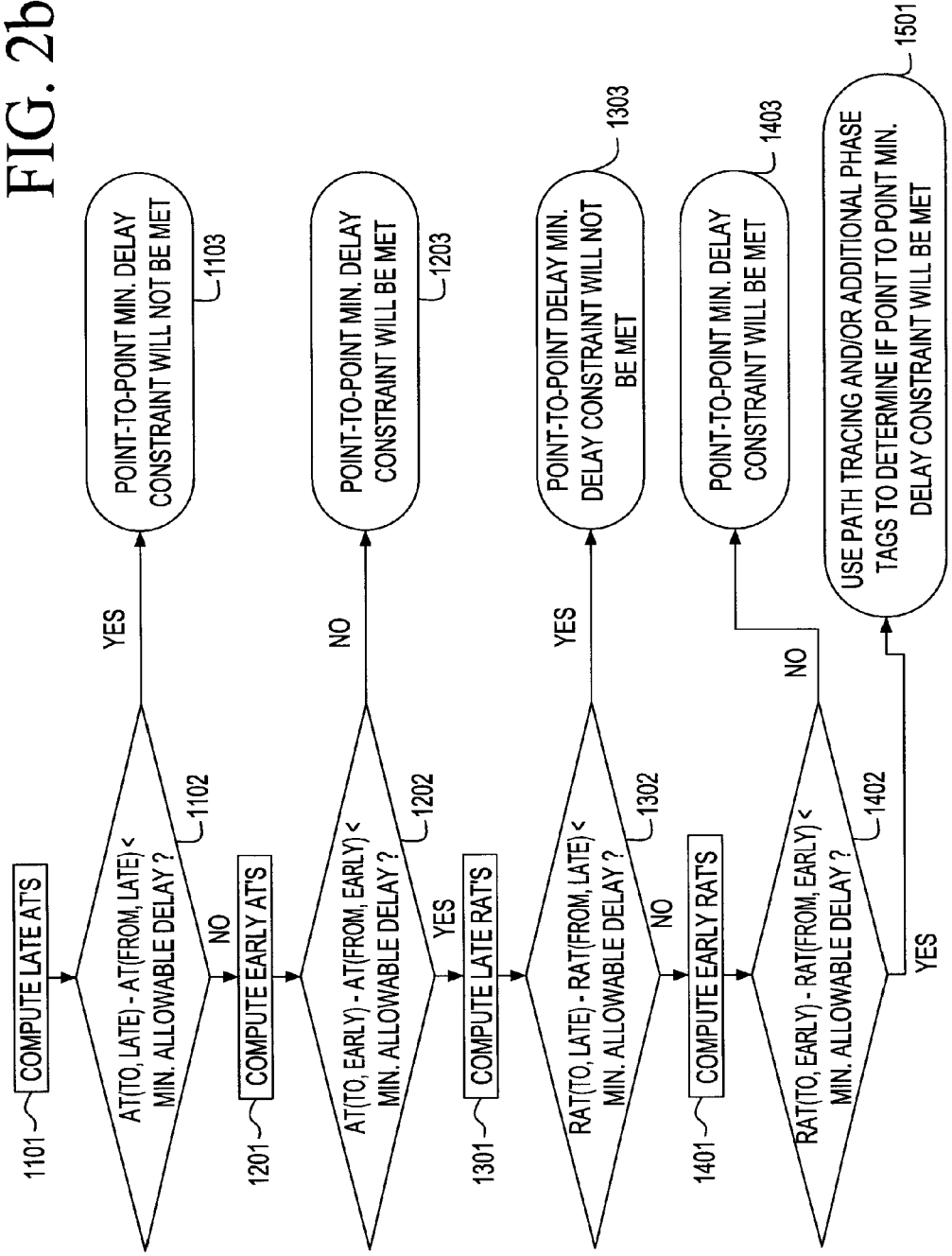

SYSTEM AND METHOD FOR EFFICIENT ANALYSIS OF POINT-TO-POINT DELAY CONSTRAINTS IN STATIC TIMING

FIELD OF THE INVENTION

The present invention generally relates to the field of Design Automation, and more particularly, to a system and method for analyzing point-to-point delay constraints in static timing analysis.

BACKGROUND OF THE INVENTION

The goal of static timing analysis (STA) is to determine the latest and earliest possible switching times of various signals within a digital circuit. STA may generally be performed at the transistor level or at the gate level, using pre-characterized library elements, or at higher levels of abstraction, for complex hierarchical chips.

STA algorithms operate by first levelizing the logic structure, and breaking any loops in order to create a directed acyclic graph (timing graph). Modern designs can often contain millions of placeable objects, with corresponding timing graphs having millions, if not tens of millions of nodes. For each node, a corresponding arrival time, transition rate (slew), and required arrival time are computed for both rising and falling transitions as well early and late mode analysis. An arrival time (AT) represents the latest or earliest time at which a signal can transition due to the entire upstream fan-in cone. The slew value is the transition rate associated with a corresponding AT, and a required arrival time (RAT) represents the latest or earliest time at which a signal must transition due to timing constraints in the entire downstream fan-out cone.

AT's are propagated forward in a levelized manner, starting from the chip primary input asserted (i.e., user-specified) arrival times, and ending at either primary output ports or intermediate storage elements. For single fan-in cases, AT sink node=AT source node+delay from source to sink.

Whenever multiple signals merge, each fan-in contributes a potential arrival time computed as AT sink (potential)=AT source+delay, making it possible for the maximum (late mode) or minimum (early mode) of all potential arrival times to be retained at the sink node. Typically an exact delay value for an edge in a timing graph is not known, but instead only a range of possible delay values can be determined between some minimum delay and maximum delay. In this case, maximum delays are used to compute late mode arrival times and minimum delays are used to compute early mode arrival times.

RATs are computed in a backward levelized manner starting from either asserted required arrival times at the chip primary output pins, or from tests (e.g., setup or hold constraints) at internal storage devices. For single fan-out cases, RAT source node=RAT sink node−delay.

When multiple fan-outs merge (or when a test is present), each fan-out (or test) contributes a prospective RAT, enabling the minimum (late mode) or maximum (early mode) required arrival time to be retained at the source node. When only a range of possible delay values can be determined, maximum delay are used to compute late mode required arrival times and minimum delays are used to compute early mode required arrival times.

The difference between the arrival time and required arrival time at a node (i.e., RAT−AT in late mode, and AT−RAT in early mode) is referred to as slack. A positive slack implies that the current arrival time at a given node meets all downstream timing constraints, and a negative slack implies that the arrival time fails at least one such downstream timing constraint. A timing point may include multiple such AT, RAT, and slew values, each denoted with a separate tag, in order to represent data associated with different clock domains (i.e., launched by different clock signals), or for the purpose of distinguishing information for a specific subset of an entire fan-in cone or fan-out cone.

In addition to asserted required arrival times at primary outputs, designers may also specify maximum and minimum path delay constraints between pairs of nodes (a "from" node, and a "to" node) in the timing graph. These path delay constraints are called point-to-point delay constraints or point-to-point delay assertions. Such constraints may be required to ensure correct operation of asynchronous timing interfaces, or to measure the cumulative path delay (e.g., from a hard-core output to a chip primary output pin), or even as a guide to help enable delay/slack apportionment techniques during optimization.

Prior art approaches to the aforementioned problem are described, for instance, in U.S. Pat. No. 6,237,127 B1 to Craven et al., in which, a method for handling path-delay constraints is set forth either employing exhaustive path tracing between the source and sink points that is well-known to have exponential computational complexity, in order to ensure that all possible paths meet the required constraint or, alternatively, to rely upon inserting additional tags in the timing graph. Tags permit differentiating an arrival time and associated slew value at the "to" node due to signals propagated from the specified "from" node, from an arrival time and associated slew value at the "to" node due to all other signals. Similarly, tags permit differentiating a required arrival time "from" node due to signals propagated backward from the specified "to" node, from a required arrival time at the "from" node due to all other signals. In essence, with tags an independent STA is performed in parallel for each point-to-point constraint (i.e., once for each tag value). Due to its exponential complexity, the path tracing method is expensive to execute incrementally and is therefore not easily usable by automated optimization methods which make numerous changes to the timing graph in order to correct for timing, power, and/or noise violations. Even when used non-incrementally, application of such point-to-point assertions may be highly time consuming due to the need to identify all possible paths between specified from and to points. Methods which use additional tags may avoid the need for explicit path tracing and therefore can be incremental; however, these techniques typically incur a large memory and runtime overhead due to the need to introduce additional tagged timing values in the entire fan-out cone of the "from" node of every such point-to-point assertion, or at all points in the intersections of the fan-out cone of the "from" node and the fan-in cone of the "to" node of the point-to-point assertion. In particular, whenever such fan-out cones interact, multiple corresponding tags will propagate in the overlapping regions of fan-out. For each such tag, a unique version of AT/RAT/slew values is computed and stored, significantly increasing the memory overhead. Furthermore, since each tag has a different slew value, and delay and slew calculation for an edge in a timing graph generally depend on the slew at the source of that edge, a unique corresponding delay and sink slew calculation is required, increasing the runtime overhead as well.

To further appreciate the use of fan-out cones, a representative example is shown in FIG. 1, illustrating an instance where such a situation occurs. In the example, two point-to-point delay constraints are present. The first is between nodes "From #1" and "To #1", and the second is between nodes "From #2" and "To #2". Nodes A, B, C are in the fan-out cones of both "From #1" and "From #2" and unique tags for each of the two point to point constraint will propagate to each of the nodes A, B and C.

In another instance, e.g., in U.S. Pat. No. 5,825,658 to Ginetti et al., special timing constraints are specified, including multi-cycle timing constraints specifying clock based timing constraints for the transmission of data between sequential data elements. Other constraints are based on timing path specifications, each indicating signal paths through the integrated circuit chip to which specified ones of multi-cycle timing constraints are applicable and signal paths to which the specified ones of the multi-cycle timing constraints are not. The system then verifies that the integrated circuit satisfies the specified timing constraints. The method is restricted to the stated special path constraints and propagation of timing information associated thereto.

Thus, there is a need in industry of a system and a method for performing STA in the presence of point-to-point delay constraints to minimize the need for exponential path tracing and/or the application of additional tags to the timing graphs.

SUMMARY OF INVENTION

Accordingly, it is an object of the invention to perform a preliminary analysis by applying in situ both conservative and optimistic bounds to the arrival and required arrival time values computed from the results of ordinary STA propagation.

It is another object of the invention to provide a process for evaluating bounds to reduce the number of instances in which more detailed path tracing and/or additional tags are required to determine whether particular point-to-point constraints have been satisfied.

These and other objects, aspects and advantages of the invention are provided by a system and a method for conducting a static timing analysis of a circuit having at least one point-to-point delay constraint between a first and second point of the circuit. The method includes the steps of:

computing from at least one of backward-propagated required arrival times and forward-propagated arrival times of the static timing analysis a first bound of a first measurement criterion on the point-to-point delay constraint; b) determining from the first bound whether the point-to-point delay constraint is guaranteed: i.) to be satisfied, ii.) not to be satisfied and iii.) is inconclusive. If the first bound is inconclusive, then a second bound of a second measurement criterion is selected, and the bounds that are based on other measurement criteria are iteratively recomputed until a point-to-point delay constraint is guaranteed to be either satisfied or not satisfied.

In one aspect of the present invention there is provided a method that enables categorizing point-to-point delay constraints as definitely passing or definitely failing, by use of both conservative and optimistic bounds which can be applied in situ. For other cases that cannot definitely be categorized as passing or failing, prior art methods may be resorted to in order to make a concrete determination. The inventive method reduces the number of instances in which exponential path tracing and/or the use of additional tags are required, when compared to prior existing methods.

BRIEF DESCRIPTION OF DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

FIGS. 2a-2b respectively show two flowcharts, the first illustrating the method steps of the present invention applied under maximum path delay constraints, and the second, the method as applied under minimum path delay constraints.

DETAILED DESCRIPTION OF AN EMBODIMENT OF THE INVENTION

Figure 1:
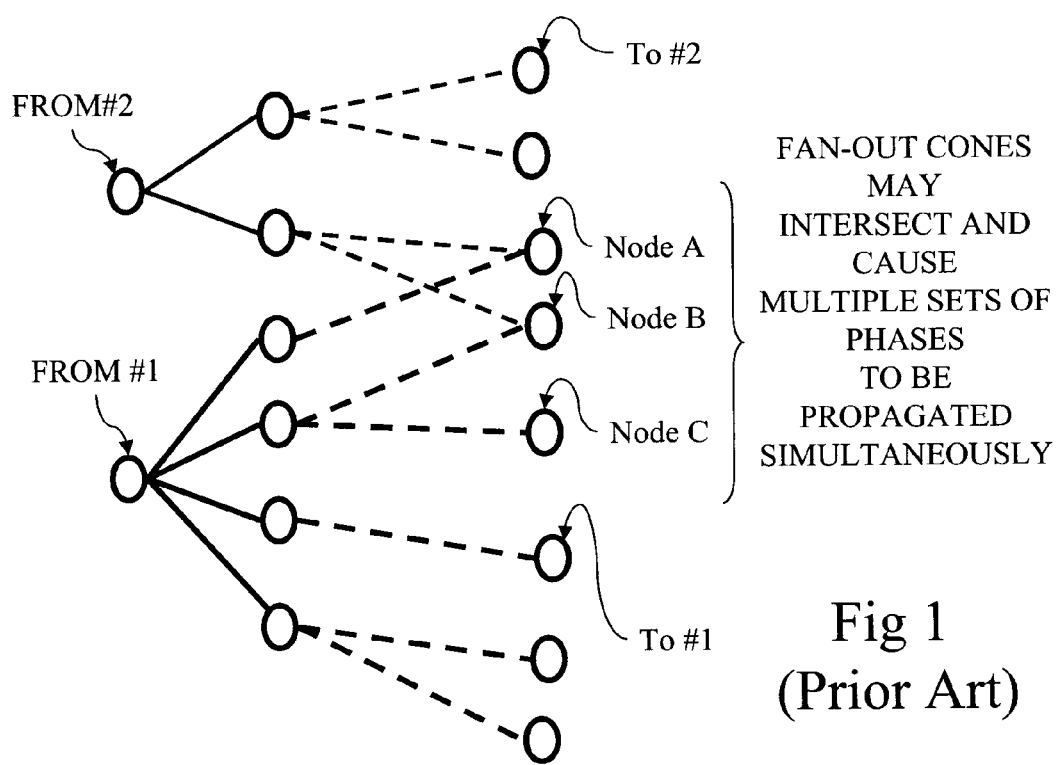
FIG. 1 shows an example illustrating a prior art method for handling path-delay constraints.

The present invention and various features, aspects and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention in detail.

Figure 2A:
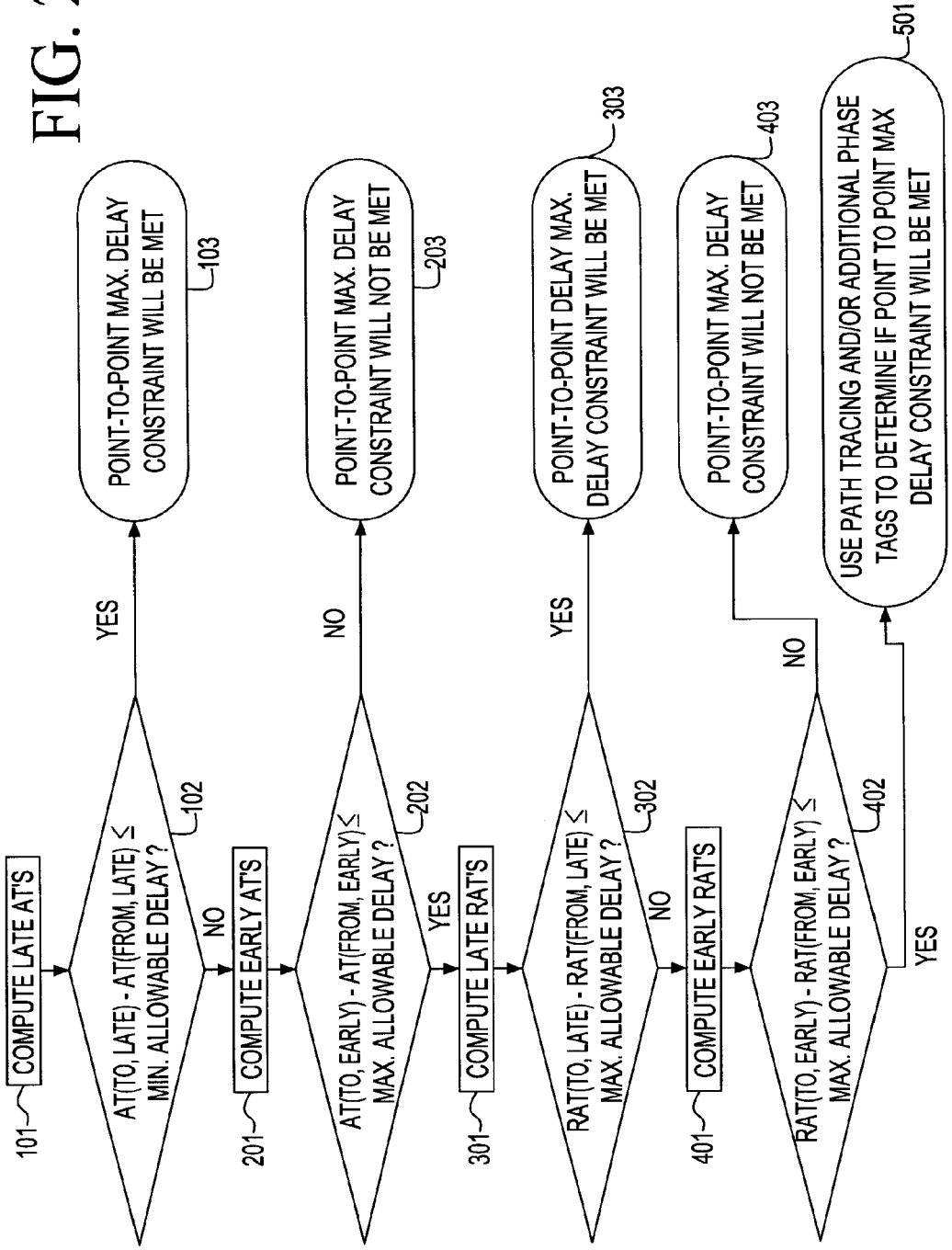

FIGS. 2a and 2b are flowcharts illustrating the inventive method as applied to maximum and minimum point to point delay constraints, respectively. In order to further appreciate the present methodology and details thereof, initially several simple illustrative examples will be provided in conjunction with the various steps of the present invention as embodied by the two flowcharts.

Figure 3:
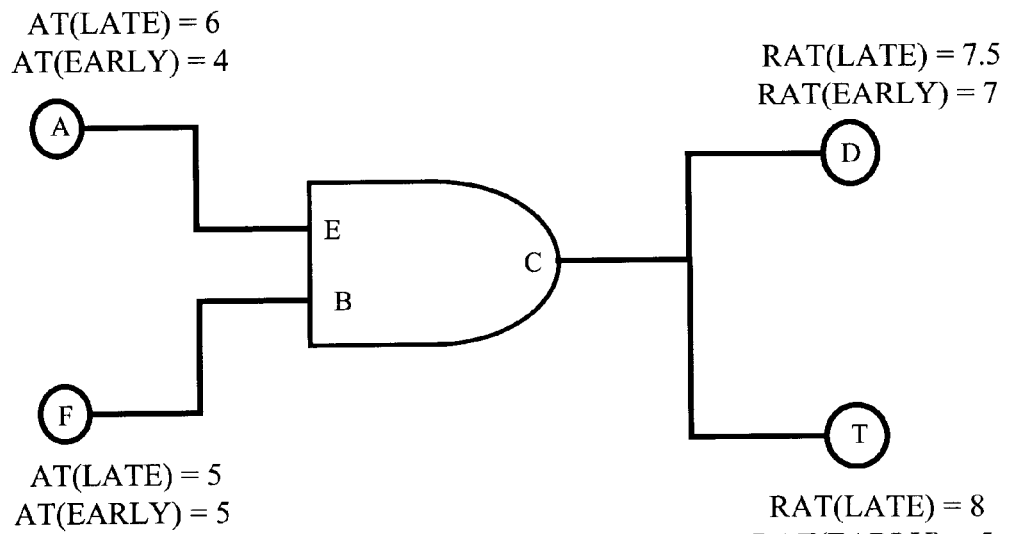
FIG. 3 shows an illustrative circuit used to describe point-to-point delay constraint existing between a primary input pin F and primary output pin T, specifying the maximum allowable propagation delay between the two signals.

Referring to FIG. 3, an illustrative circuit is shown comprising two primary input pins A and F, two primary output pins D and T, connected to each other through an AND logic gate. A point-to-point delay constraint exists between primary input pin F and primary output pin T, specifying the maximum allowable propagation delay between these two signals.

For illustrative purposes, and without loss of generality, each stage of logic and wire delay is assumed to have a delay of 1 time unit (e.g., nanosecond). Similarly, and without loss of generality, primary input node F is assumed to have a user-specified late mode and early mode ATs of 5. Primary input node A is assumed to have user-specified late and early mode ATs of 6 and 4, respectively. Finally, without loss of generality, primary output pin T is assumed to have user specified late and early mode RATs of 8 and 5, respectively, and primary output pin D is assumed to have user-specified late and early mode RATs of 7.5 and 7, respectively.

Figure 4:
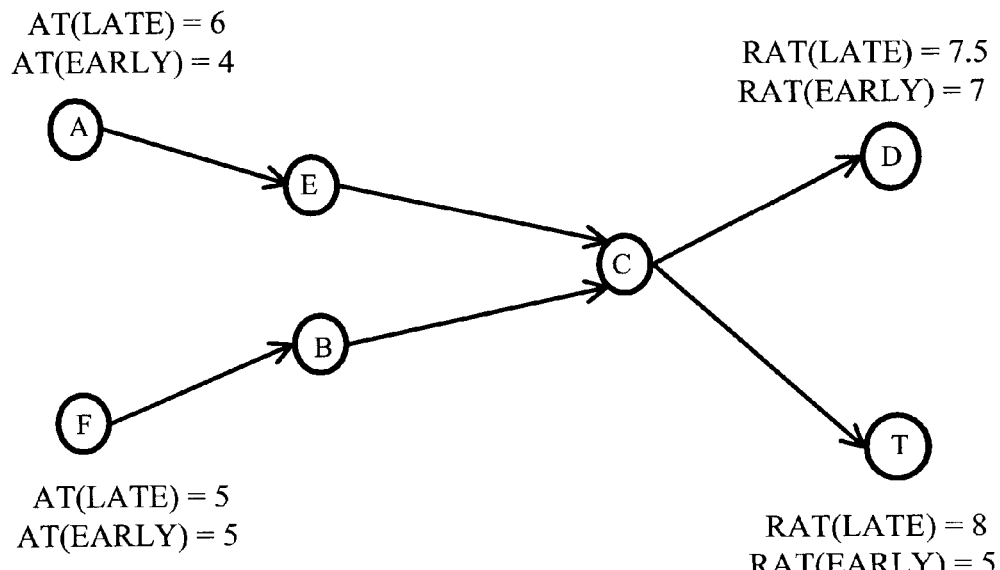
FIG. 4 is a timing graph of nodes corresponding to input/output signals of the primary input/output pins of the circuit, and edges representing the propagation of an electrical transition between two nodes.

A corresponding timing graph of the previously illustrated circuit is shown in FIG. 4. Each node corresponds to an input or output signal of the logic element or primary input/output pin of the circuit, and each edge represents the propagation of an electrical transition between two such nodes, i.e., a signal transition at the source (or FROM) end of the edge that could, under some side input sensitization conditions, cause a signal transition at the sink (or TO) end of the edge.

Figure 5:
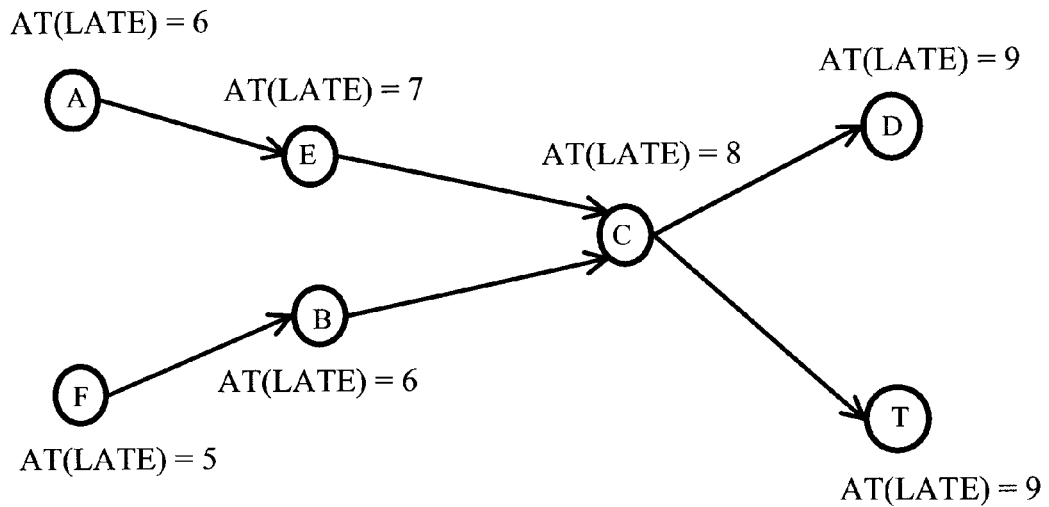
FIG. 5 is a timing graph of the same illustrative circuit indicating late mode arrival times at all nodes.

Referring to FIG. 5, late mode arrival times from the various nodes in the example circuit are first propagated (FIG. 2a, Step 101). Calculated arrival times for the representative circuit are indicated in FIG. 4. Note where multiple incoming edges merge (e.g., at node C), a single late mode arrival time is stored, based on the maximum incoming (source AT+delay) value across all incoming edges. Due to this dominance property of late mode arrival time calculation, for any given FROM and TO nodes which are topologically connected, the measurement criterion AT(TO, late)−AT (FROM, late) will be greater than or equal to the actual path delay of interest. Thus, a conservative bound on the maximum delay between any given from node (FROM) and to node (TO) can computed directly by evaluating late mode arrival times of TO and FROM, and comparing the difference AT(TO, late)−AT (FROM, late) against the maximum allowable path delay (Step 102). In the present example, AT(T, late)−AT(F, late) =9−5=4, which is greater than the actual delay (i.e., 3) from F to T. Therefore, if the maximum allowable delay from F to T, is 4 or greater, it can be established that the maximum point-to-point delay constraint WILL be met (FIG. 2a, Step 103), without the need for explicit path tracing or introduction of additional tags, as would be required by prior art methods.

Figure 6:
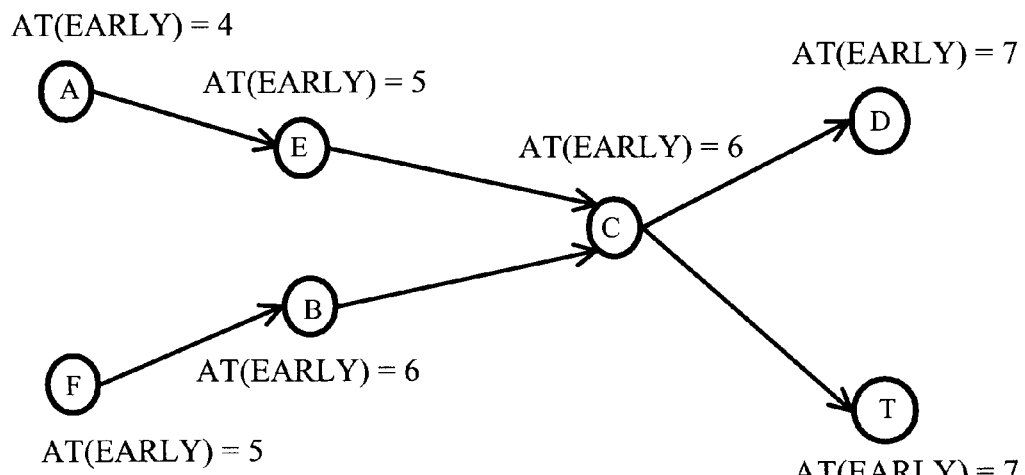
FIG. 6 is a timing graph of the same illustrative circuit indicating early mode arrival times at all nodes.

Referring to FIG. 6, early mode arrival times are illustrated (FIG. 2a, Step 201). Note that for early mode calculation, wherever multiple incoming edges merge (e.g., node C), a single early mode arrival time is stored based on the minimum incoming (source AT+delay) value across all incoming edges. Due to this dominance property of early mode arrival time calculation, for any given FROM and TO nodes which are topologically connected, the measurement criterion AT(TO, early)−AT(FROM, early) will be less than or equal to the actual path delay of interest. Thus, an optimistic bound on the maximum path delay between any given from node (FROM) and to node (TO) can be computed directly by evaluating the early mode arrival times of TO and FROM, and comparing the difference AT(TO, early)−AT(FROM, early) against the maximum allowable path delay (Step 202). In this example, AT(T, early)−AT(F, early)=7−5=2, which is less than the actual delay of 3. Therefore, if the maximum allowable delay from F to T is less than 2, it can be established that the maximum point-to-point delay constraint WILL NOT be met (FIG. 2a, Step 203), without the need for explicit path tracing or introduction of additional tags, as would be required per prior art methods.

Figure 7:
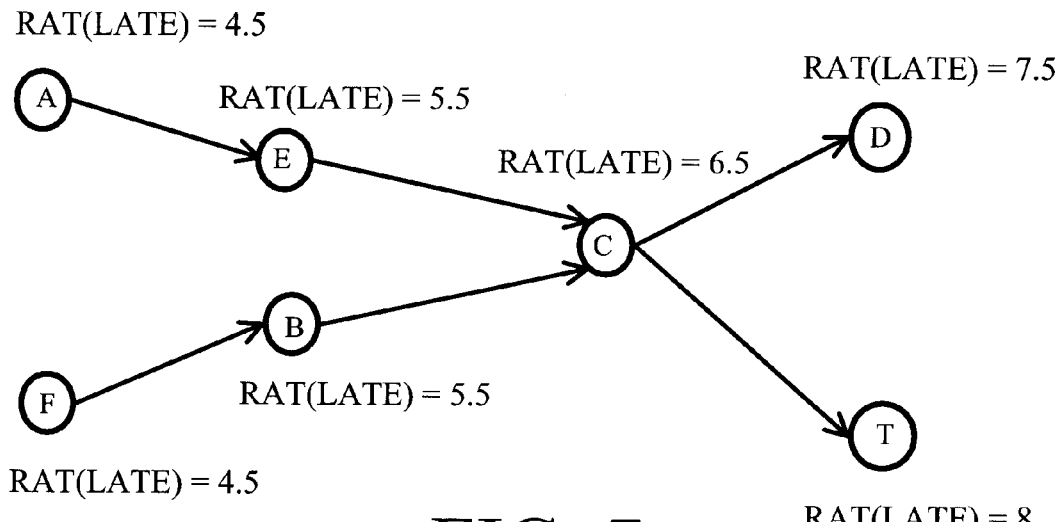
FIG. 7 is a timing graph of the same illustrative circuit indicating late mode required arrival times at all nodes.

Referring to FIG. 7, late mode required arrival times for the illustrative circuit are depicted in FIG. 2a, Step 301). Note that for late mode RAT calculation, wherever multiple outgoing edges merge at a node (e.g., node C), a single late mode RAT is stored, corresponding to the minimum (sink RAT−delay) value across all outgoing edges. Due to this dominance property of late mode RAT calculation, for any given FROM and TO nodes which are topologically connected, the measurement criterion RAT (TO, late)−RAT (FROM, late) will be greater than or equal to the actual path delay of interest. Thus, a different (when compared to the late mode AT based bound described in FIG. 2a, Step 102) conservative bound for the maximum delay between any given from node (FROM) and to node (TO) can be computed directly by evaluating late mode required arrival times at TO and FROM and comparing the difference RAT(TO, late)−RAT (FROM, late) against the maximum allowable path delay (Step 302). In the present example, RAT(T, late)−RAT(F, late)=8−4.5=3.5, which is greater than the actual path delay of 3. Therefore, if the maximum allowable path delay from F to T is 3.5 or more, it can be established that the maximum point-to-point delay constraint WILL be met (Step 303), without the need for explicit path tracing or introducing additional tags, as would be required per prior art methods.

Note that in the present example, the late mode RAT constraint provides a tighter (smaller) bound on the maximum path delay between T and F. In general, the tighter bound may come from either an AT or a RAT based constraint, depending on the topology of the circuit, the individual element delay values, and the asserted late mode AT and RAT values at primary inputs and outputs, respectively.

Figure 8:
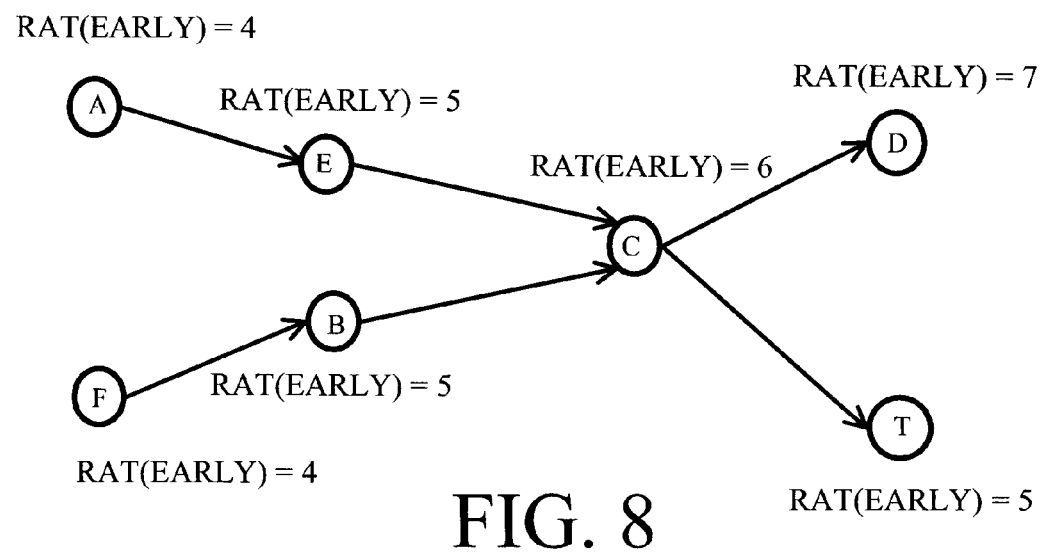
FIG. 8 is a timing graph of the same illustrative circuit indicating early mode required arrival times at all nodes.

Referring to FIG. 8, early mode required arrival times for the sample circuit are illustrated (FIG. 2a, Step 401). Note that for early mode RAT calculation, wherever multiple outgoing edges merge at a node (e.g., node C), a single early mode RAT is stored, corresponding to the maximum of all (sink RAT−delay) values across all outgoing edges. Due to this dominance property of early mode RAT calculation, for any given FROM and TO nodes which are topologically connected, the measurement criterion RAT(TO, early)−RAT (FROM, early) will be less than or equal to the actual path delay of interest. Thus, a different optimistic bound (as compared to the early mode AT based bound described in FIG. 2a, Step 202) for the maximum delay between any given from node (FROM) and to node (TO) can be computed directly by evaluating early mode required arrival times at TO and FROM and comparing the difference RAT(TO, early)−RAT (FROM, early) against the maximum allowable path delay (FIG. 2a, Step 402). In this example, RAT(T, early)−RAT(F, early)=5−4=1, which is less than the actual path delay of 3. Therefore, if the maximum allowable path delay from F to T is less than 1, it can be established that the maximum point-to-point delay constraint WILL NOT be met (FIG. 2a, Step 403), without the need for explicit path tracing or introducing additional tags, as would be required per prior art methods.

Note that in this specific example, the late mode AT constraint provides a tighter (larger) bound on the minimum path delay between T and F. In general, the tighter bound may come from either an AT or a RAT constraint, depending on the topology of the circuit, the individual element delay values, and the asserted early mode AT and RAT values at primary inputs and outputs, respectively.

Finally, if none of the steps above definitively establishes the outcome of the maximum point to be point delay constraint, then explicit path tracing and/or introduction of additional tags can be used (Step 501).

Having shown various examples, FIG. 2b will now be explained in more detail. The same AT and RAT measurements can be used to establish optimistic and conservative bounds on a minimum path delay constraint. For a minimum delay constraint, late mode ATs (Step 1101) can be used to establish an optimistic bound on the minimum circuit delay between any FROM and TO nodes which are topologically connected (Step 1102). Referring to the late ATs of the illustrative example shown in FIG. 5, if the minimum allowable path delay from F to T is greater than AT(T, late)−AT(F, late)=9−5=4, it can be established that the point to point minimum delay constraint WILL NOT be met (Step 1103).

Similarly, early mode ATs (Step 1201) can be used to establish a conservative bound on the minimum circuit delay between any FROM and TO nodes which are topologically connected (Step 1202). Referring to the early ATs of the illustrative example shown in FIG. 6, if the minimum allowable path delay from F to T is AT(T, early)−AT(F, early)=7−5=2, or less, it can be established that the point to point minimum delay constraint WILL be met (Step 1203).

Late mode RATs (Step 1301) can similarly be used to establish an optimistic bound on the minimum circuit delay between any FROM and TO nodes which are topologically connected (Step 1302). Referring to the late RATs of the illustrative example shown in FIG. 7, if the minimum allowable path delay from F to T is greater than RAT(T, late)−RAT(F, late)=8−4.5=3.5, it can be established that the point to point minimum delay constraint WILL NOT be met (Step 1303).

Similarly, early mode RATs (Step 1401) can be used to establish a conservative bound on the minimum circuit delay between any FROM and TO nodes which are topologically connected (Step 1402). Referring to the early RATs of the illustrative example shown in FIG. 8, if the minimum allowable path delay from F to T is RAT(T, early)−RAT(F, early)=5−4=1, or less, it can be established that the point to point minimum delay constraint WILL be met (Step 1403).

Finally, if none of the steps above definitively establishes the outcome of the minimum point to be point delay constraint, then explicit path tracing and/or introduction of additional tags can be used (Step 1501).

In summary, the present invention provides a method for efficiently analyzing point-to-point delay constraints by applying successive optimistic and conservative bounds in situ, based on propagated arrival time and required arrival time values. Arrival and required time bounds are independent and the tightest such bound can be used on each point-to-point delay constraint to reduce the number of cases where explicit path tracing or additional tags are required. This represents a key improvement over the previous prior-art methods which require ALL such constraints to be analyzed using path tracing techniques or additional tags, which introduce significant runtime and memory overhead.

While the invention was described by means of a simple illustrative embodiment, it is to be understood that one of ordinary skill in the art can extend and apply this invention in many obvious ways. It is to be understood that while the illustrative example showed a small circuit and a small timing graph, the invention applies to circuits and graphs of any size. In the illustrative example, for purposes of clarity, rising and falling timing quantities were not differentiated, but one of ordinary skill in the art could apply the present invention to a situation with different rising and falling delays, slews, ATs and RATs. Otherwise, it could also apply the invention to any type of static timing, including, but not limited to, static timing of gate-level circuits, transistor-level circuits, hierarchical circuits, circuits with combinational logic, circuits with sequential logic, timing in the presence of coupling noise, timing in the presence of multiple-input switching, timing in the presence of arbitrary timing tests such as setup, hold, end-of-cycle, pulse width, clock gating and loop-cut tests, and timing in the presence of multiple clock domains. It is also to be understood that while the flowcharts of FIGS. 2a and 2b focused on a single point-to-point delay constraint, other embodiments of the invention can be adapted to any number of such constraints simultaneously. It will further be understood that the point-to-point delay constraints considered by the present invention may have been imposed for various purposes, including but not limited to ensuring correct operation of asynchronous timing interfaces, measurement of the cumulative delay of a particular path, for guidance of delay/slack apportionment techniques during optimization, or determining correct operation of a multi-cycle path. The various conservative and optimistic bounds of the inventive technique can be applied in any order to obtain a quick determination of the status of a point-to-point delay constraint. For example, all ATs and RATs can first be computed before computing the conservative and optimistic bounds. Alternatively, AT-based constraints can first be applied, and then RAT-based constraints applied only if still necessary. It is to be noted that the conservative and optimistic bounds constitute an efficient technique of finding both a lower bound and an upper bound on the point-to-point delay between any two nodes of the timing graph.

Finally, the present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction with exemplary embodiments, it is evident that many alternatives, modifications and variations will be apparent to those skilled in the art in light of the present description. It is therefore contemplated that the appended claims will embrace any such alternatives, modifications and variations as falling within the true scope and spirit of the present invention.

It should be understood, however, that the description, while indicating preferred embodiments of the present invention and numerous specific details thereof, is given by way of illustration and not of limitation. Many changes and modifications may be made within the scope of the present invention without departing from the spirit thereof, and the invention includes all such modifications.

What is claimed is:

1. A method for conducting a static timing analysis on a circuit having at least one point-to-point delay constraint between a first and second point of the circuit, the method comprising:

a) computing at least one of forward propagated arrival times along paths not originating at said first point, and backward propagated required arrival times along paths not terminating at said second point;

b) computing at least one bound on said point-to-point delay constraint as at least one of a difference between one of said forward propagated arrival times at said first point and another of said forward propagated arrival times at said second point, and a difference between one of said backward propagated required arrival times at said first point and another of said backward propagated required times at said second point; and c) based on said bound, classifying said point-to-point delay constraint as exactly one of: satisfied, not satisfied, and inconclusive; and if said classification of said point-to-point delay constraint determines that it is not satisfied, modifying said circuit until said point-to-point delay constraint is satisfied, wherein said steps of computing and classifying being executed by a computer.

2. The method as recited in claim 1, wherein said point-to-point delay constraint is selected from the group consisting of minimum delay constraints, maximum delay constraints, and any combination thereof.

3. The method as recited in claim 2, wherein said point-to-point delay constraint has a maximum delay constraint and said bounds computed based on said measurement criteria comprise at least one of:
  comparing late mode arrival times producing a conservative bound on satisfaction of said point-to-point maximum delay constraint;
  comparing late mode required arrival times producing a second conservative bound on satisfaction of said point-to-point maximum delay constraint, comparing early mode arrival times producing an optimistic bound on satisfaction of said point-to-point maximum delay constraint, and comparing early mode required arrival times producing a second optimistic bound on satisfaction of said point-to-point maximum delay constraint.

4. The method as recited in claim 3, wherein said at least one bound is selected from the group consisting of optimistic bounds, conservative bounds, AT-based bounds, RAT-based bounds, and any combination thereof in any order.

5. The method as recited in claim 2, wherein said point-to-point delay constraint has a minimum delay constraint and said bounds computed based on said measurement criteria comprise:
  comparing late mode arrival times producing an optimistic bound on satisfaction of said point-to-point maximum delay constraint;
  comparing late mode required arrival times producing a second optimistic bound on satisfaction of said point-to-point maximum delay constraint;
  comparing of early mode arrival times producing a conservative bound on satisfaction of said point-to-point maximum delay constraint; and
  comparing early mode required arrival times produces another conservative bound on satisfaction of said point-to-point maximum delay constraint.

6. The method as recited in claim 5, wherein said at least one bound is selected from the group consisting of optimistic bounds, conservative bounds, AT-based bounds, RAT-based bounds, and any combination thereof in any order.

7. The method as recited in claim 1, wherein said static timing analysis is performed on at least one of gate-level circuits, transistor-level circuits, hierarchical circuits, circuits with combinational logic, and circuits with sequential logic.

8. The method as recited in claim 1, wherein timing of said static timing analysis includes analysis of at least one of coupling noise, multiple-input switching, and arbitrary timing tests.

9. The method as recited in claim 8, wherein said arbitrary timing tests are performed on the group selected from setup, hold, end-of-cycle, pulse width, clock gating and loop-cut tests.

10. The method as recited in claim 1, wherein said timing of said static timing analysis is performed in presence of multiple clock domains.

11. The method as recited in claim 1, wherein said static timing analysis includes determining rise and fall times.

12. The method as recited in claim 1, wherein said at least one point-to-point delay constraint is a multi-cycle path constraint.

13. The method as recited in claim 1, wherein said at least one point-to-point delay constraint is an asynchronous path constraint.

14. A program storage device readable by a machine, tangibly embodying a program of instructions executable by the machine to perform method steps for conducting a static timing analysis on a circuit having at least one point-to-point delay constraint between a first and second point of the IC chip, said method steps comprising:
  a) computing at least one of forward propagated arrival times along paths not originating at said first point, and backward propagated required arrival times along paths not terminating at said second point;
  b) computing at least one bound on said point-to-point delay constraint as at least one of a difference between one of said forward propagated arrival times at said first point and another of said forward propagated arrival times at said second point, and a difference between one of said backward propagated required arrival times at said first point and another of said backward propagated required times at said second point; and
  c) based on said bound, classifying said point-to-point delay constraint as exactly one of: satisfied, not satisfied, and inconclusive; and if said classification of said point-to-point delay constraint determines that it is not satisfied, modifying said circuit until said point-to-point delay constraint is satisfied, wherein said steps of computing and classifying being executed by a computer.

* * * * *